(12) United States Patent
Sato et al.

(10) Patent No.: US 10,751,804 B2
(45) Date of Patent: Aug. 25, 2020

(54) SURFACE-COATED CUTTING TOOL

(71) Applicant: MITSUBISHI MATERIALS CORPORATION, Tokyo (JP)

(72) Inventors: Shun Sato, Anpachi-gun (JP); Tsuyoshi Ogami, Naka (JP); Koichi Tanaka, Los Angeles, CA (US); Tatsuo Hashimoto, Akashi (JP); Natsuki Ichimiya, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 176 days.

(21) Appl. No.: 16/080,211

(22) PCT Filed: Feb. 28, 2017

(86) PCT No.: PCT/JP2017/007880
§ 371 (c)(1),
(2) Date: Aug. 27, 2018

(87) PCT Pub. No.: WO2017/150550
PCT Pub. Date: Sep. 8, 2017

(65) Prior Publication Data
US 2019/0070668 A1    Mar. 7, 2019

(30) Foreign Application Priority Data

Feb. 29, 2016   (JP) ................................. 2016-038258
Aug. 31, 2016   (JP) ................................. 2016-168781
Feb. 21, 2017   (JP) ................................. 2017-030048

(51) Int. Cl.
| | |
|---|---|
| *B23B 27/14* | (2006.01) |
| *C23C 30/00* | (2006.01) |
| *C23C 14/32* | (2006.01) |
| *C23C 28/04* | (2006.01) |
| *C23C 14/06* | (2006.01) |
| *C23C 28/00* | (2006.01) |
| *B23F 21/00* | (2006.01) |

(52) U.S. Cl.
CPC .......... *B23B 27/14* (2013.01); *C23C 14/0641* (2013.01); *C23C 14/325* (2013.01);
(Continued)

(58) Field of Classification Search
USPC ........... 51/307, 309; 428/697, 698, 699, 704
See application file for complete search history.

(56) References Cited

U.S. PATENT DOCUMENTS

2007/0278090 A1    12/2007   Yamamoto et al.
2008/0075976 A1*   3/2008   Yamamoto ............ C23C 30/005
                                                              428/704

(Continued)

FOREIGN PATENT DOCUMENTS

| CN | 101014435 A | 8/2007 |
|---|---|---|
| CN | 105008074 A | 10/2015 |

(Continued)

OTHER PUBLICATIONS

Pulugurtha S. R. et al., "Mechanical and tribological properties of compositionally graded CrAlN films deposited by AC reactive magnetron sputtering", *Surface & Coatings Technology*, Aug. 3, 2007, pp. 1160-1166, vol. 202.

(Continued)

*Primary Examiner* — Archene A Turner
(74) *Attorney, Agent, or Firm* — Leason Ellis LLP

(57) ABSTRACT

At least a $(Al_{1-a-b-c}Cr_aSi_bCu_c)N$ (where $0.15 \leq a \leq 0.40$, $0.05 \leq b \leq 0.20$, and $0.005 \leq c \leq 0.05$) layer is provided on a surface of a tool body, a Cr concentration or a Cu concentration periodically changes in a layer thickness direction, a concentration Crmax in a highest content point of Cr is in a range of $a < Crmax \leq 1.3a$, a concentration Crmin in a lowest content point of Cr is in a range of $0.50a \leq Crmin < a$, and optionally in a case where a Cu composition at one point z along the layer thickness direction is represented by $c_z$ and (Continued)

a Cr composition at the point z is represented by $a_z$, $(c_z/a_z)/(c/a)$ is 0.7 to 1.5 over the layer thickness direction entirely.

4 Claims, 4 Drawing Sheets

(52) U.S. Cl.
CPC .......... *C23C 28/044* (2013.01); *C23C 28/048* (2013.01); *C23C 28/42* (2013.01); *C23C 28/44* (2013.01); *C23C 30/005* (2013.01); *B23B 2228/08* (2013.01); *B23B 2228/105* (2013.01); *B23B 2228/36* (2013.01); *B23F 21/00* (2013.01)

(56) References Cited

U.S. PATENT DOCUMENTS

| | | | | |
|---|---|---|---|---|
| 2009/0130465 | A1* | 5/2009 | Vetter | C23C 14/06 428/446 |
| 2011/0183131 | A1 | 7/2011 | Maeda et al. | |
| 2015/0291800 | A1 | 10/2015 | Soebisch et al. | |

FOREIGN PATENT DOCUMENTS

| | | |
|---|---|---|
| DE | 69713389 T2 | 2/2003 |
| EP | 2336382 A1 | 6/2011 |
| JP | 2004-050381 A | 2/2004 |
| JP | 3781374 B | 5/2006 |
| JP | 2007-290091 A | 11/2007 |
| JP | 2008-031517 A | 2/2008 |
| JP | 2009-039838 A | 2/2009 |
| JP | 2016-500752 A | 1/2016 |
| WO | WO-98/26106 | 6/1998 |
| WO | WO-2011/062450 A3 | 11/2011 |
| WO | WO-2016/021581 A | 2/2016 |

OTHER PUBLICATIONS

International Search Report dated May 16, 2017 for the corresponding International Patent Application No. PCT/JP2017/007880.
Office Action dated Jun. 4, 2019 for the corresponding Chinese Patent Application No. 201780012954.6.
European Search Report dated Jun. 14, 2019 for the corresponding European Patent Application No. 17760015.2.

* cited by examiner

SURFACE-COATED CUTTING TOOL

CROSS-REFERENCE TO RELATED PATENT APPLICATIONS

This application is a U.S. National Phase application under 35 U.S.C. § 371 of International Patent Application No. PCT/JP2017/007880, filed Feb. 28, 2017, and claims the benefit of Japanese Patent Application No. 2016-038258, filed Feb. 29, 2016, Japanese Patent Application No. 2016-168781, filed on Aug. 31, 2016, and Japanese Patent Application No. 2017-030048, filed on Feb. 21, 2017, all of which are incorporated herein by reference in their entirety. The International Application was published in Japanese on Sep. 8, 2017 as International Publication No. WO/2017/150550 under PCT Article 21(2).

FIELD OF THE INVENTION

The present invention relates to a surface-coated cutting tool (hereinafter, referred to as coated tool) in which a hard coating layer exhibits excellent wear resistance and cracking resistance during high-speed intermittent cutting work of high hardness steel such as hardened steel, and excellent cutting performance is exhibited for a long-term usage.

BACKGROUND OF THE INVENTION

In general, as coated tools, throw-away tips which are detachably attached to the tip portion of an insert holder to be used for turning or planing a work material such as various kinds of steel and cast iron, drills or miniature drills used for drilling or the like of the work material, end mills used for facing, grooving, shoulder milling, and the like of the work material, solid hobs and pinion cutters used for gear cutting of the work material into tooth shapes, and the like are known.

In addition, various suggestions have hitherto been made for the purpose of improving the cutting performance of coated tools.

For example, as described in Japanese Patent No. 3781374, a coated tool is suggested in which a surface of a tool body made of tungsten carbide (hereinafter, referred to as WC)-based cemented carbide, titanium carbonitride (hereinafter, referred to as TiCN)-based cermet, or the like is coated with one or more hard layers having a cubic structure composed of a metal component primarily containing Cr, Al, and Si and at least one element selected from C, N, O, and B such that the fracturing resistance and wear resistance are improved.

In addition, Japanese Unexamined Publication No. 2008-31517 describes a coated tool in which a surface of a tool body is coated with a hard coating layer, and at least one layer of a hard film is represented by (MaLb)Xc (where, M represents at least one metal element selected from Cr, Al, Ti, Hf, V, Zr, Ta, Mo, W and Y, L represents at least one additive element selected from Mn, Cu, Ni, Co, B, Si, and S, X represents at least one non-metallic element selected from C, N and O, a represents an atomic ratio of M to the sum of M and L, b represents an atomic ratio of L to the sum of M and L, c represents an atomic ratio of X to the sum of M and L, and a, b, and c satisfy $0.85 \le a \le 0.99$, $0.01 \le b \le 0.15$, $a+b=1$, and $1.00 < c \le 1.20$), respectively. As a result, crystal grain refinement and crystal stability are achieved by Cu, Si, and the like which are the components of the hard film, and thus high-temperature hardness is increased, wear resistance is improved, and oxidation resistance is improved.

Further, Japanese Publication No. 2004-50381 discloses a coated tool in which a hard coating layer formed of a complex nitride of Cr and Al is formed by physical vapor deposition on a surface of a tool body. In the coated tool, the hard coating layer has a component concentration distribution structure in which a highest Al content point and a lowest Al content point are alternately and present repeatedly at predetermined intervals in a layer thickness direction and an Al content continuously changes between the highest Al content point and the lowest Al content point, the highest Al content point satisfies a composition formula: $(Cr_{1-X}Al_X)N$ (where X represents 0.40 to 0.60 in terms of atomic ratio), the lowest Al content point satisfies a composition formula: $(Cr_{1-Y}Al_Y)N$ (where Y represents 0.05 to 0.30 in terms of atomic ratio), and the interval between the highest Al content point and the lowest Al content point adjacent to each other is 0.01 to 0.1 μm. As a result, the hard coating layer exhibits excellent chipping resistance under heavy cutting conditions.

Technical Problem

An improvement in performance of a machine tool in recent years has been remarkable, and there has been a strong demand for power saving and energy saving during cutting work and a further reduction in cost. In accordance with this, there is a trend toward a further increase in speed and efficiency during cutting work. However, there is no particular problem in a case where the coated tool of the related art is used for cutting work of steel, cast iron, or the like under typical cutting conditions. However, in a case where the coated tool of the related art is used for high-speed intermittent cutting work during which high-temperature heat is generated and high impact and intermittent loads are exerted on a cutting edge, for example, for high-speed milling of high hardness steel such as hardened steel, the occurrence and propagation of cracking cannot be suppressed. Furthermore, wear progression is promoted. Therefore, in the current situation, the coated tool of the related art reaches the end of its service life within a relatively short period of time.

For example, in the coated tool of the related art described in Japanese Patent No. 3781374, an Al component of an (Al,Cr,Si)N layer forming the hard coating layer has an effect of improving high-temperature hardness, a Cr component of the (Al,Cr,Si)N layer has an effect of improving high-temperature toughness and high-temperature strength and improving high-temperature oxidation resistance in a state in which Al and Cr coexist with each other, and a Si component of the (Al,Cr,Si)N layer has an effect of improving heat-resistant plastic deformability. However, under cutting conditions under which high-temperature heat is generated and high impact and intermittent loads are exerted on a cutting edge, the occurrence of chipping, fracturing, and the like cannot be avoided. For example, even in a case where there is an attempt to improve the high-temperature toughness and high-temperature strength by increasing the Cr content ratio, the wear resistance deteriorates due to a relative reduction in the Al content ratio. Therefore, there is a limitation on the improvement in the wear resistance and cracking resistance of the hard coating layer formed of the (Al,Cr,Si)N layer.

In addition, in the coated tools of the related art described in Japanese Unexamined Publication No. 2008-31517, it is suggested that crystal grain refinement is achieved by adding Cu as a component of the hard coating layer such that the wear resistance is improved. However, while the wear resistance is improved, the toughness deteriorates such that the occurrence of cracking cannot be suppressed, and the tool life is short. Further, in the coated tool of the related art described in Japanese Unexamined Publication No. 2004-50381, the composition modulated structure in which the component concentration repeatedly changes in the hard coating layer is formed, and high-temperature hardness and heat resistance are achieved by the highest Al content point (corresponding to a lowest Cr content point). On the other hand, the strength of the hard coating layer is secured by the lowest Al content point (corresponding to a highest Cr content point) adjacent to the highest Al content point (corresponding to the lowest Cr content point) such that chipping resistance and wear resistance are secured. However, although the coated tool of the related art is effective to some extent for cutting work of ordinary steel, alloy steel, or cast iron, it cannot be said that chipping resistance and wear resistance are sufficient for cutting work of high hardness steel (for example, HRC 60 or higher) due to high impact and intermittent loads exerted on a cutting edge.

Solution to Problem

Therefore, from the above-described viewpoints, the present inventors intensively conducted researches to develop a coated tool in which a hard coating layer exhibits excellent chipping resistance and wear resistance under cutting conditions under which high-temperature heat is generated and high impact and intermittent loads are exerted on a cutting edge, for example, during high-speed milling of high hardness steel such as hardened steel, while focusing on components that forms the hard coating layer and a layer structure thereof. As a result, the following knowledge was obtained.

That is, the present inventors found that the hard coating layer can be made to have toughness and wear resistance by adopting the following configurations including: a configuration in which wear resistance is improved due to crystal grain refinement by adding Cu as a component of the hard coating layer formed of the (Al,Cr,Si)N layer; a configuration in which the hard coating layer is configured as a layer having a composition modulated structure in which the Cr component concentration periodically changes along the layer thickness direction; and further a configuration in which the hard coating layer is configured as a layer having the above-described composition modulated structure in which the Cr component concentration and the Cu component concentration periodically change at the same phase. Even in a case where the coated tool including the hard coating layer is used under cutting conditions under which high-temperature heat is generated and high impact and intermittent loads are exerted on a cutting edge (for example, high-speed milling conditions of high hardness steel such as hardened steel), excellent chipping resistance and wear resistance are exhibited for a long-term usage.

SUMMARY OF THE INVENTION

The present invention is made based on the above-described knowledge and has the following aspects.

(1) A surface-coated cutting tool including: a tool body made of any of tungsten carbide-based cemented carbide, titanium carbonitride-based cermet and a cubic boron nitride-based sintered material; and a hard coating layer that is provided on a surface of the tool body, in which (a) the hard coating layer includes at least a complex nitride layer of Al, Cr, Si, and Cu with an average layer thickness of 0.5 to 8.0 μm, (b) in a case where the complex nitride layer is represented by a composition formula: $(Al_{1-a-b-c}Cr_aSi_bCu_c)N$, the complex nitride layer has an average composition that satisfies $0.15 \leq a \leq 0.40$, $0.05 \leq b \leq 0.20$, and $0.005 \leq c \leq 0.05$, each of a, b, and c being in atomic ratio, (c) the complex nitride layer has a composition modulated structure in which a Cr component concentration periodically changes along a layer thickness direction, (d) the periodic change in the Cr component concentration of the composition modulated structure is a change in which a highest content point of the Cr component and a lowest content point of the Cr component are repeated at an interval of 5 nm to 100 nm, and (e) in a case where an average local maximum of the Cr component concentration in the highest content point of the Cr component is represented by Crmax, the average local maximum is in a range of $a<Crmax \leq 1.3a$, and in a case where an average local minimum of the Cr component concentration in the lowest content point of the Cr component is represented by Crmin, the average local minimum is in a range of $0.5a \leq Crmin < a$, where a represents the Cr average composition a in the composition formula of (b).

(2) The surface-coated cutting tool according to (1), in which the change in the Cr component concentration is a continuous change along the layer thickness direction.

(3) A surface-coated cutting tool including: a tool body made of any of tungsten carbide-based cemented carbide, titanium carbonitride-based cermet and a cubic boron nitride-based sintered material; and a hard coating layer that is provided on a surface of the tool body, in which (a) the hard coating layer includes at least a complex nitride layer of Al, Cr, Si, and Cu with an average layer thickness of 0.5 to 8.0 μm, (b) in a case where the complex nitride layer is represented by a composition formula: $(Al_{1-a-b-c}Cr_aSi_bCu_c)N$, the complex nitride layer has an average composition that satisfies $0.15 \leq a \leq 0.40$, $0.05 \leq b \leq 0.20$, and $0.005 \leq c \leq 0.05$, each of a, b, and c being in atomic ratio, (c) the complex nitride layer has a composition modulated structure in which a Cr component concentration periodically changes along a layer thickness direction and a composition modulated structure in which a Cu component concentration periodically changes along the layer thickness direction, (d) the periodic change in the Cr component concentration of the composition modulated structure is a change in which a highest content point of the Cr component and a lowest content point of the Cr component are repeated at an interval of 5 nm to 100 nm, (e) an average local maximum Crmax of the Cr component concentration in the highest content point of the Cr component is in a range of $a<Crmax \leq 1.30a$, and an average local minimum Crmin of the Cr component concentration in the lowest content point of the Cr component is in a range of $0.5a \leq Crmin < a$, where a represents the Cr average composition a in the composition formula of (b), (f) the periodic change in the Cu component concentration of the composition modulated structure is a change in which a highest content point of the Cu component and a lowest content point of the Cu component are repeated at an interval of 5 nm to 100 nm, and (g) in a case where a Cu composition at one measurement point z along the layer thickness direction is represented by $c_z$ and a Cr composition at the measurement point z is represented by $a_z$, a value (($c_z/a_z$)/(c/a)) obtained by dividing a value ($c_z/a_z$) of a ratio of $c_z$ to $a_z$ by a value (c/a) of a ratio of a Cu average composition c to a Cr average composition a in the complex nitride layer is in a range of $0.7 \leq (c_z/a_z)/(c/a) \leq 1.5$ over the layer thickness direction entirely.

(4) The surface-coated cutting tool according to claim 3, in which the change in the Cr component concentration and the Cu component concentration is a continuous change along the layer thickness direction.

Advantageous Effects of Invention

In the coated tool according to the aspect of the present invention (hereinafter, referred to as "coated tool according to the present invention"), the hard coating layer includes at least the (Al,Cr,Si,Cu)N Layer having the predetermined composition, the Cr component concentration in the (Al,Cr,Si,Cu)N Layer periodically changes along the layer thickness direction, and the highest Cr content point and the lowest Cr content point are present. As a result, a remarkable effect of exhibiting excellent cracking resistance and wear resistance in the (Al,Cr,Si,Cu)N Layer as a whole can be obtained.

In addition, in the coated tool according to the present invention, the hard coating layer includes a layer including at least the (Al,Cr,Si,Cu)N Layer having the predetermined average composition, the composition of each of the components forming the (Al,Cr,Si,Cu)N Layer periodically changes along the layer thickness direction, and in a case where the Cu composition in one measurement point z along the layer thickness direction is represented by $c_z$, the Cr composition at the point z is represented by $a_z$, the Cu average composition of the (Al,Cr,Si,Cu)N Layer is represented by c, and the Cr average composition of the (Al,Cr,Si,Cu)N Layer is represented by a, the value (($c_z/a_z$)/(c/a)) obtained by dividing the value ($c_z/a_z$) of the ratio of $c_z$ to $a_z$ by the value (c/a) of the ratio of c to a satisfies a relationship of $0.7 \leq (c_z/a_z)/(c/a) \leq 1.5$ over the layer thickness direction entirely of the (Al,Cr,Si,Cu)N Layer. Therefore, chipping resistance and wear resistance are simultaneously improved. That is, although the Cr component is periodically modulated, the modulation range ($c_z/a_z$)/(c/a) of the ratio between Cr and Cu has only a small change. In other words, the (Al,Cr,Si,Cu)N Layer has a structure in which the compositions of Cr and Cu are similarly modulated while maintaining a given ratio. As a result, a change in lattice strains in the layer can be made more significant, and excellent toughness as a whole is exhibited.

Accordingly, the coated tool according to (1) to (4) of the present invention has the remarkable effect of exhibiting excellent chipping resistance and wear resistance for a long-term usage during high-speed intermittent cutting work, for high-speed milling of high hardness steel such as hardened steel during which high-temperature heat is generated and high impact and mechanical loads are exerted on a cutting edge.

DETAILED DESCRIPTION OF THE INVENTION

Figure 1A:
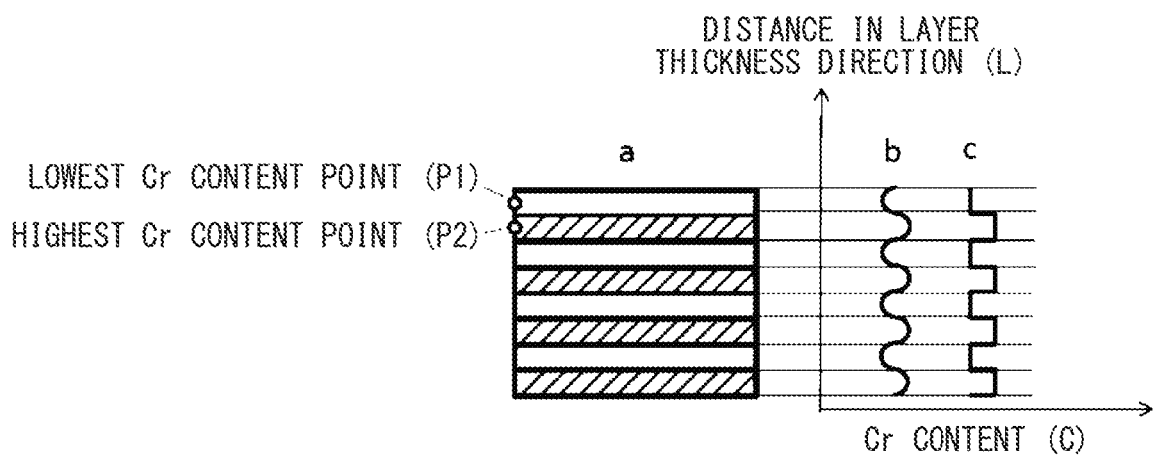
FIG. 1A is a schematic diagram illustrating a structure of an (Al,Cr,Si,Cu)N Layer of a hard coating layer of a coated tool according to the present invention.

Next, a coated tool according to the present invention will be described in detail.

Hard Coating Layer:

The coated tool according to the present invention includes at least a complex nitride layer of Al, Cr, Si, and Cu (hereinafter, referred to as "(Al,Cr,Si,Cu)N layer") as a hard coating layer, in which an Al component of the (Al,Cr,Si,Cu)N layer has an effect of improving high-temperature hardness, a Cr component of the (Al,Cr,Si,Cu)N layer has an effect of improving high-temperature toughness and high-temperature strength and improving high-temperature oxidation resistance in a state in which Al and Cr coexist with each other, a Si component of the (Al,Cr,Si,Cu)N layer has an effect of improving heat-resistant plastic deformability, and a Cu component of the (Al,Cr,Si,Cu)N layer has an effect of improving wear resistance by refining crystal grains.

Composition of (Al,Cr,Si,Cu)N Layer:

In addition, in a case where an a value (atomic ratio) representing the Cr average composition in the (Al,Cr,Si,Cu)N Layer is lower than 0.15 in terms of a ratio thereof to the total content of Al, Si, and Cu, the minimum required high-temperature toughness and high-temperature strength cannot be secured. Therefore, the occurrence of cracking which causes chipping and fracturing cannot be suppressed. On the other hand, in a case where the a value is higher than 0.40, wear progression is promoted due to a relative reduction in the Al content ratio. Therefore, the a value is set to 0.15 to 0.40. In addition, in a case where a b value (atomic ratio) representing the Si average composition is lower than 0.05 in terms of a ratio thereof to the total content of Al, Cr, and Cu, the improvement in wear resistance due to the improvement in heat-resistant plastic deformability cannot be expected. On the other hand, in a case where the b value is higher than 0.20, there is a trend toward a reduction in the effect of improving the wear resistance. Therefore, the b value is set to 0.05 to 0.20. Furthermore, in a case where a c value (atomic ratio) representing the Cu average composition is lower than 0.005 in terms of a ratio thereof to the total content of Al, Cr, and Si, further improvement in wear resistance cannot be expected. In a case where the c value is higher 0.05, particles are likely to be formed when the (Al,Cr,Si,Cu)N layer is formed using an arc ion plating (hereinafter, referred to as "AIP") apparatus, and cracking resistance deteriorates during cutting work during which high impact and mechanical loads are exerted. Therefore, the c value is set to 0.005 to 0.05.

Preferable ranges of a, b, and c are $0.15 \leq a \leq 0.25$, $0.05 \leq b \leq 0.15$, $0.01 \leq c \leq 0.03$, respectively.

Average Layer Thickness of (Al,Cr,Si,Cu)N Layer:

In a case where the average layer thickness of the (Al,Cr,Si,Cu)N layer is less than 0.5 µm, excellent wear resistance cannot be exhibited for a long-term usage. In a case where the average layer thickness thereof exceeds 8.0 µm, cracking which causes chipping and fracturing are likely to occur. Therefore, the average layer thickness of the (Al,Cr,Si,Cu)N layer is set to 0.5 to 8.0 µm.

Structure of (Al,Cr,Si,Cu)N Layer:

The (Al,Cr,Si,Cu)N Layer of the hard coating layer of the coated tool according to the present invention has a composition modulated structure in which the concentration of at least one component including the Cr component periodically change continuously or discontinuously (stepwise) along a layer thickness direction. First, the composition modulated structure will be described with reference to the schematic diagram of FIG. 1A by using the Cr component as an example, but the same shall be applied to the other components. Irrespective of whether the periodic change of the concentration is a continuous change (b in FIG. 1A) or a discontinuous (stepwise) change (c in FIG. 1A), the Cr component concentration periodically changes along the layer thickness direction at a predetermined interval, for example, highest Cr content point (P2)-lowest Cr content point (P1)-highest Cr content point (P2)-lowest Cr content point (P1), and . . . . Here, the highest content point and the lowest content point will be described. The highest content point of Cr (P2) refers to a local maximum in a portion in which the Cr component concentration at each measurement point measured along the layer thickness direction is continuously higher than a value of an average concentration ratio a of the Cr component in the composition formula $(Al_{1-a-b-c}Cr_aSi_bCu_c)N$ of the entire layer. In a case where a plurality of portions where the Cr component concentration is continuously higher than the value of a are present, a local maximum in each of the portions is defined as the highest content point in the portion. Likewise, the lowest content point of Cr (P1) refers to a local minimum in a portion in which the Cr component concentration at each measurement point measured along the layer thickness direction is continuously lower than the value of the average concentration ratio a of the Cr component in the composition formula $(Al_{1-a-b-c}Cr_aSi_bCu_c)N$ of the entire layer. In a case where a plurality of portions where the Cr component concentration is continuously lower than the value of a are present, a local minimum in each of the portions is defined as the lowest content point in the portion. According to this definition, in the periodic change in the vicinity of the value of a, the highest content point and the lowest content point alternately appears as illustrated in FIG. 1A.

Figure 1B:
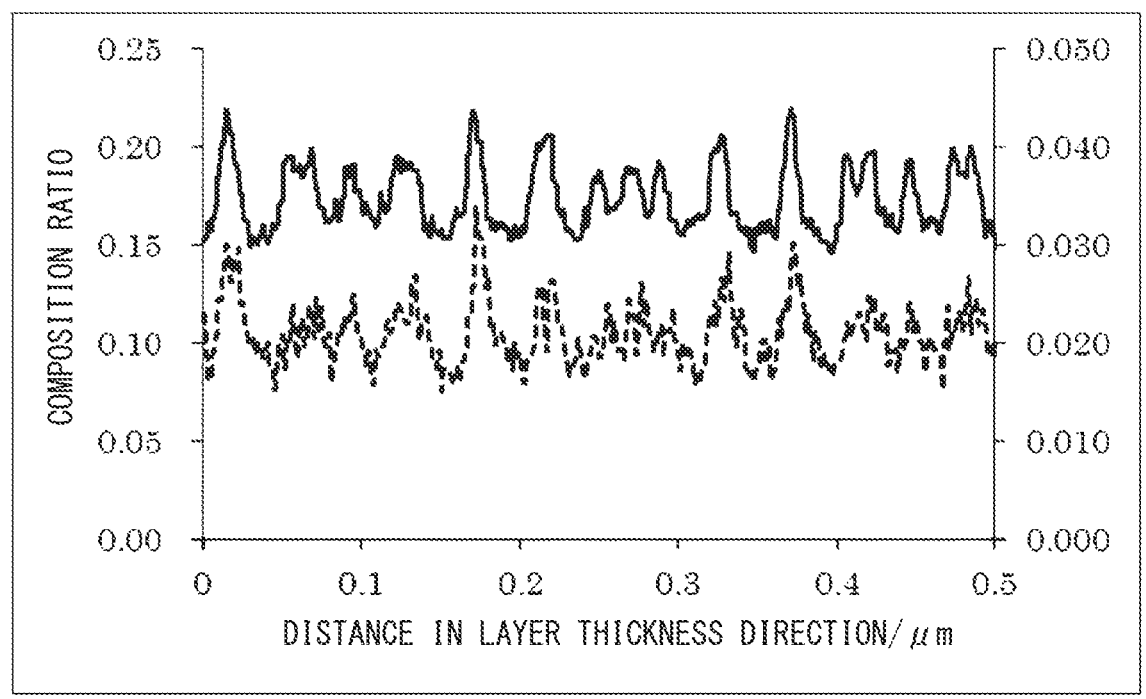
FIG. 1B is a diagram illustrating a state where the compositions of a Cr component and a Cu component are modulated in the structure of the (Al,Cr,Si,Cu)N Layer of the hard coating layer of the coated tool according to the present invention.
Figure 1C:
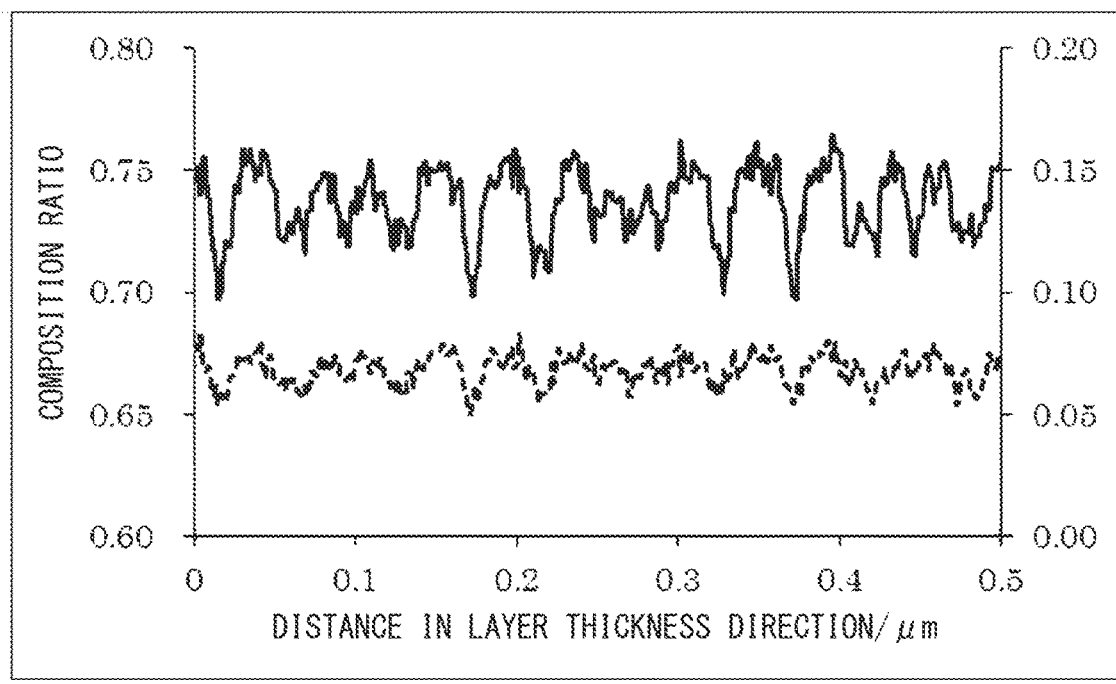
FIG. 1C is a diagram illustrating a state where the compositions of an Al component and a Si component are modulated in the structure of the (Al,Cr,Si,Cu)N Layer of the hard coating layer of the coated tool according to the present invention.

Next, the description will be made with reference to FIGS. 1B and 1C illustrating the actual composition modulated structure. In the drawings, the concentrations of a plurality of components periodically change. That is, FIG. 1B illustrates a state where the Cr component concentration (indicated by a solid line in FIG. 1B) and the Cu component concentration (indicated by a dotted line in FIG. 1B) periodically change along the layer thickness direction in the (Al,Cr,Si,Cu)N Layer of the hard coating layer of the coated tool according to the present invention. In addition, FIG. 1C illustrates a state where the Al component concentration (indicated by a solid line in FIG. 1C) and the Si component concentration (indicated by a dotted line in FIG. 1C) periodically change along the layer thickness direction. As illustrated in FIGS. 1B and 1C, the concentrations of the Cr component and the Cu component periodically change at the same phase, and the concentrations of the Al component and the Si component periodically change at the same phase. In other words, the concentrations of the Cr component and the Cu component and the concentrations of the Al component and the Si component change in pairs, respectively, to form a composition modulated structure.

As described above, examples of the form of the composition modulated structure of the (Al,Cr,Si,Cu)N Layer of the hard coating layer of the coated tool according to the present invention includes a case (refer to b in FIG. 1A) where the component concentration of Cr as a component forming the layer continuously changes along the layer thickness direction and a case (refer to c in FIG. 1A) where the component concentration of Cr discontinuously (stepwise) changes along the layer thickness direction. In the present invention, any one of the forms can be adopted. However, from the viewpoint of exhibiting the effect of improving the wear resistance and heat resistance of the hard coating layer and improving the cracking resistance of the layer as a whole during cutting work during which high impact and intermittent loads are exerted on a cutting edge, in order to affinity between the highest Cr content point (P2) and the lowest Cr content point (P1) in the layer, it is more preferable that the Cr component concentration in the composition modulated structure continuously changes.

Average Value of Cr Concentration in Each Highest Cr Content Point (P2) in Composition Modulation of Cr Component:

The Cr component in the (Al,Cr,Si,Cu)N Layer of each highest Cr content point (P2) has an effect of improving the strength of the layer and improving cracking resistance. However, in a case where Crmax representing the average content ratio of the Cr concentration at which a local maximum is obtained at each highest Cr content point (P2) is higher than 1.30a (where the value of a represent the Cr average composition a in the composition formula of (Al,Cr,Si,Cu)N Layer: $(Al_{1-a-b-c}Cr_aSi_bCu_c)$), the content ratios of Al, Si, and Cu relatively decrease. Therefore, even in a case where lowest Cr content points (P1) having high hardness are present adjacent to each other, deterioration of heat resistance and wear resistance of the layer as a whole is not avoidable. On the other hand, Crmax representing the average Cr content ratio in each highest Cr content point (P2) is not equal to or lower than a according to its definition. Therefore, the value of Crmax representing the average Cr concentration in each highest Cr content point (P2) is set to be higher than a and 1.30a or lower. It is preferable that the value of Crmax satisfies $1.03a \leq Crmax \leq 1.25a$.

Average Value of Cr Concentration in Each Lowest Cr Content Point in Composition Modulation of Cr Component:

As described above, the highest Cr content point (P2) has relatively high toughness and improves cracking resistance. On the other hand, the hardness is relatively low, the wear resistance deteriorates, and the heat resistance deteriorates. Therefore, in order to compensate for insufficient wear resistance and insufficient heat resistance of the highest Cr content point (P2), the lowest Cr content point (P1) in which the Cr content ratio is relatively low such that the wear resistance and heat resistance of the layer as a whole are improved is periodically and alternately formed in the thickness direction. Accordingly, in a case where Crmin representing the average content ratio of the Cr concentration at which a local minimum is obtained at each lowest Cr content point (P1) is lower than 0.50a (where the value of a represent the Cr average composition a in the composition formula of (Al,Cr,Si,Cu)N Layer: ($Al_{1-a-b-c}Cr_aSi_bCu_c$)), the content ratios of Al, Si, and Cu relatively increase, and the wear resistance and heat resistance are improved. However, due to a decrease in strength, the cracking resistance deteriorates, and the effect of improving wear resistance and heat resistance cannot be expected. On the other hand, Crmin representing the Cr content ratio in each lowest Cr content point (P1) is not equal to or higher than a according to its definition. Therefore, the value of Crmin representing the Cr concentration in each lowest Cr content point (P1) is set to be 0.50a or higher and lower than a. It is preferable that the value of Crmin satisfies $0.65a \le Crmin \le 0.95a$.

Interval Between Highest Cr Content Point and Lowest Cr Content Point:

In a case where the interval between the highest Cr content point (P2) and the lowest Cr content point (P1) is less than 5 nm, it is difficult form the points distinctly from each other. As a result, desired high strength, high-temperature hardness, and heat resistance of the layer cannot be secured. In addition, in a case where the interval is more than 100 nm, respective defects of the points locally appear in the layer. That is, the strength is insufficient at the lowest Cr content point (P1), and the high-temperature hardness and heat resistance are insufficient at the highest Cr content point (P2). Due to the reasons, cracking is likely to occur in a cutting edge, and wear progression is promoted. Therefore, the interval between the highest Cr content point (P2) and the lowest Cr content point (P1) is set to be 5 nm to 100 nm.

Figure 2:
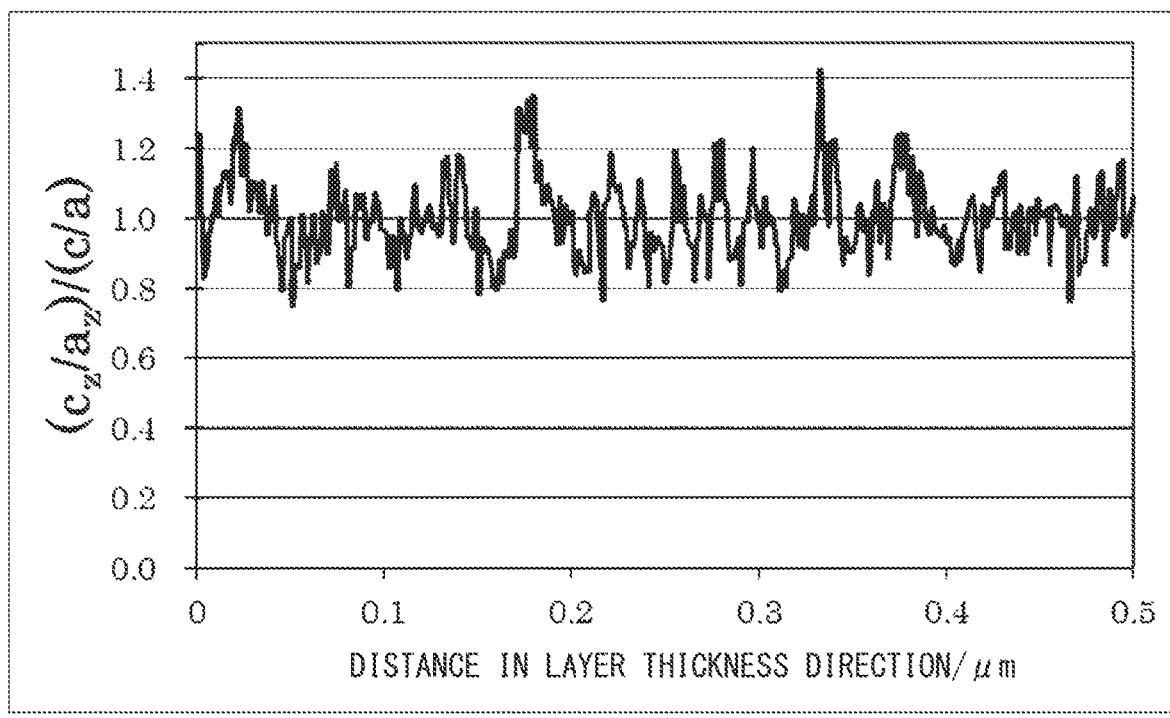
FIG. 2 is a diagram illustrating an example of a relationship between each position in the layer thickness direction of the (Al,Cr,Si,Cu)N Layer of the hard coating layer of the coated tool according to the present invention and a value of ($c_z/a_z$)/(c/a) obtained at the position.

Composition Modulated Structure of Cu Component:

As described above, the Cu component exhibits the composition modulation at the same phase as the Cr component, and the interval between the highest Cu content point and the lowest Cu content point is 5 nm to 100 nm. The composition modulation of the Cu component and the composition modulation of the Cr component are the same in phase and period, and further a predetermined relationship is maintained between the Cu component concentration and the Cr component concentration. That is, assuming that the Cu composition at one point z in the layer thickness direction of the (Al,Cr,Si,Cu)N Layer is represented by cz, the Cr composition at the point z is represented by $a_z$, the Cu average composition of the (Al,Cr,Si,Cu)N Layer is represented by c, and the Cr average composition of the (Al,Cr,Si,Cu)N Layer is represented by a, in a case where a value (($c_z/a_z$)/(c/a)) obtained by dividing a value ($c_z/a_z$) of a ratio of $c_z$ to $a_z$ by a value (c/a) of a ratio of c to a is lower than 0.7, desired toughness can be exhibited. In addition, in a case where the value (($c_z/a_z$)/(c/a)) is higher than 1.5, cracking is likely to occur in a cutting edge. Therefore, (cz/az)/(c/a) is set to be 0.7 to 1.5. FIG. 2 is a diagram illustrating an example of a relationship between each position in the layer thickness direction of the (Al,Cr,Si,Cu)N Layer of the hard coating layer of the coated tool according to the present invention and a value of ($c_z/a_z$)/(c/a) obtained at the position. It can be seen from FIG. 2 that the value of ($c_z/a_z$)/(c/a) satisfies a relationship of $0.7 \le (c_z/a_z)/(c/a) \le 1.5$ over the layer thickness direction entirely.

In the (Al,Cr,Si,Cu)N Layer of the hard coating layer of the coated tool according to the present invention, by forming the composition modulated structure, in particular, the nanometer-order composition modulated structure of Cr and Cu, lattice strains can be significantly modulated (due to the fact that the ionic radius of Cr and Cu is more than that of Al and Si). On the other hand, in a region where the concentration of Cr and Cu are high, crystal grain refinement is promoted due to the Cu component such that the wear resistance can be improved. Accordingly, in the (Al,Cr,Si, Cu)N Layer of the hard coating layer of the coated tool according to the present invention, in particular, due to the refinement effect caused by the modulation of lattice strains and the Cu component, cracking that occurs during high-speed intermittent cutting work is induced in an in-plane direction (direction substantially parallel to a surface of the tool body) without propagating and progressing in the layer thickness direction of the hard coating layer. As a result, the occurrence of chipping and fracturing caused by the propagation and progress of cracking can be suppressed.

In the hard coating layer of the coated tool according to the present invention, the (Al,Cr,Si,Cu)N Layer having the composition modulated structure can be formed as follows. For example, in order to form the (Al,Cr,Si,Cu)N Layer using an AIP apparatus (4) illustrated in FIG. 3, the tool body is charged into the AIP apparatus (4), arc discharge is generated for deposition between the tool body that is rotating while revolving on a rotation table (2) and a target for forming the highest content point of Cr or Cr and Cu (in other words, the lowest content point of Al and Si). Concurrently, arc discharge is generated for deposition between the tool body that is rotating while revolving on the rotation table (2) and a target for forming the lowest content point of Cr or Cr and Cu (in other words, the highest content point of Al and Si). As a result, the (Al,Cr,Si,Cu)N Layer having the composition modulated structure can be formed. On the other hand, after generating arc discharge for deposition between the tool body and the target (5) for forming the highest content point of Cr or Cr and Cu, the arc discharge is stopped. Next, after generating arc discharge for deposition between the tool body and the target (6) for forming the lowest content point of Cr or Cr and Cu, the arc discharge is stopped. These operations are alternately performed. As a result, the (Al,Cr,Si,Cu)N Layer having the discontinuous (stepwise) composition modulated structure can be formed.

It is not necessary that crystals forming the (Al,Cr,Si, Cu)N Layer of the hard coating layer of the coated tool according to the present invention have a specific crystal structure. It is preferable that the crystals are crystals having a cubic structure, crystals having a hexagonal structure, or a mixture of crystals are crystals having a cubic structure and crystals having a hexagonal structure.

EXAMPLES

Next, the coated tool of the present invention will be described in more detail with reference to examples.

In the following examples, a coated tool in which a tool body is formed of tungsten carbide-based cemented carbide will be described, but the same shall be applied to a case where a tool body is formed of titanium carbonitride-based cermet, and a cubic boron nitride-based sintered material.

Example 1

As base powders, medium coarse WC powder having an average particle size of 5.5 µm, fine WC powder having an average particle size of 0.8 µm, a TaC powder having an average particle size of 1.3 µm, NbC powder having an average particle size of 1.2 µm, ZrC powder having an average particle size of 1.2 µm, $Cr_3C_2$ powder having an average particle size of 2.3 µm, VC powder having an average particle size of 1.5 µm, (Ti,W)C [TiC/WC=50/50 in mass ratio] powder having an average particle size of 1.0 µm, and Co powder having an average particle size of 1.8 µm were prepared. These base powders were mixed with each other according to mixing compositions shown in Table 1, respectively. Further, wax was added thereto, and the components were mixed in acetone using a ball mill for 24 hours, and the mixture was dried under reduced pressure and extruded and pressed into various green compacts having predetermined shapes under a pressure of 100 MPa. The green compacts were heated to a predetermined temperature in a range of 1370° C. to 1470° C. at a temperature increase rate of 7° C./min in a vacuum atmosphere at 6 Pa, were held at this temperature for one hour, and were sintered under furnace cooling conditions. As a result, round bar sintered materials for forming cutting tool bodies having a diameter of 10 mm were formed. Further, by grinding the round bar sintered materials, each of cutting tool bodies (end mills) 1 to 3 made of WC-based cemented carbide having a cutting edge portion with a dimension (diameter×length) of 6 mm×12 mm and having a two-edge ball shape with a helix angle of 30 degrees was manufactured.

Figure 3A:
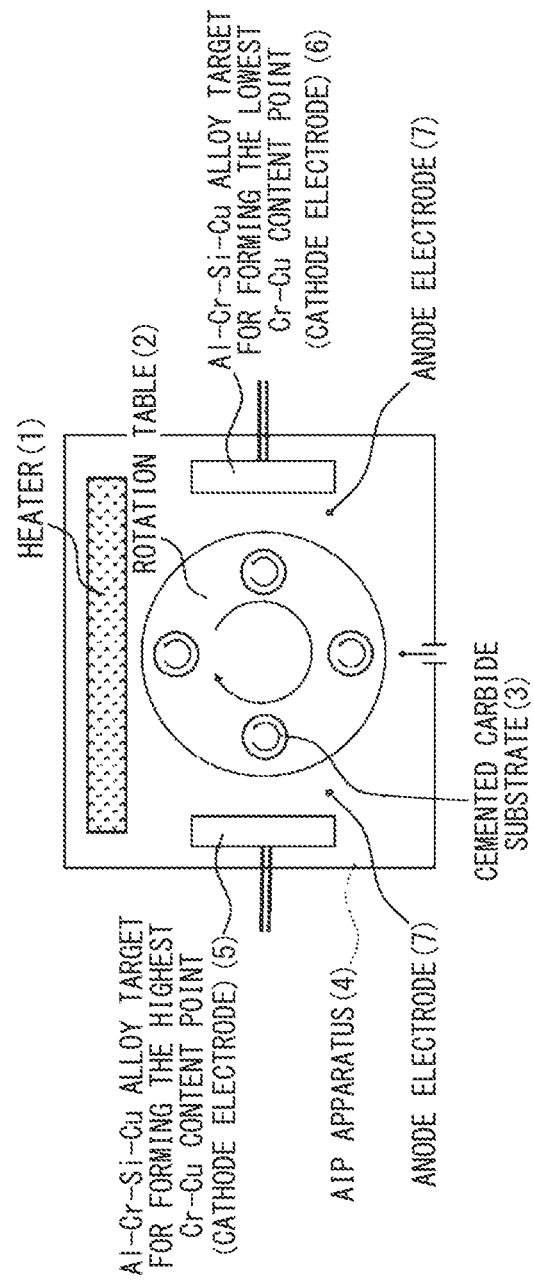
FIG. 3A is a schematic plan view illustrating an arc ion plating (AIP) apparatus used to form the (Al,Cr,Si,Cu)N Layer of the coated tool according to the present invention.
Figure 3B:
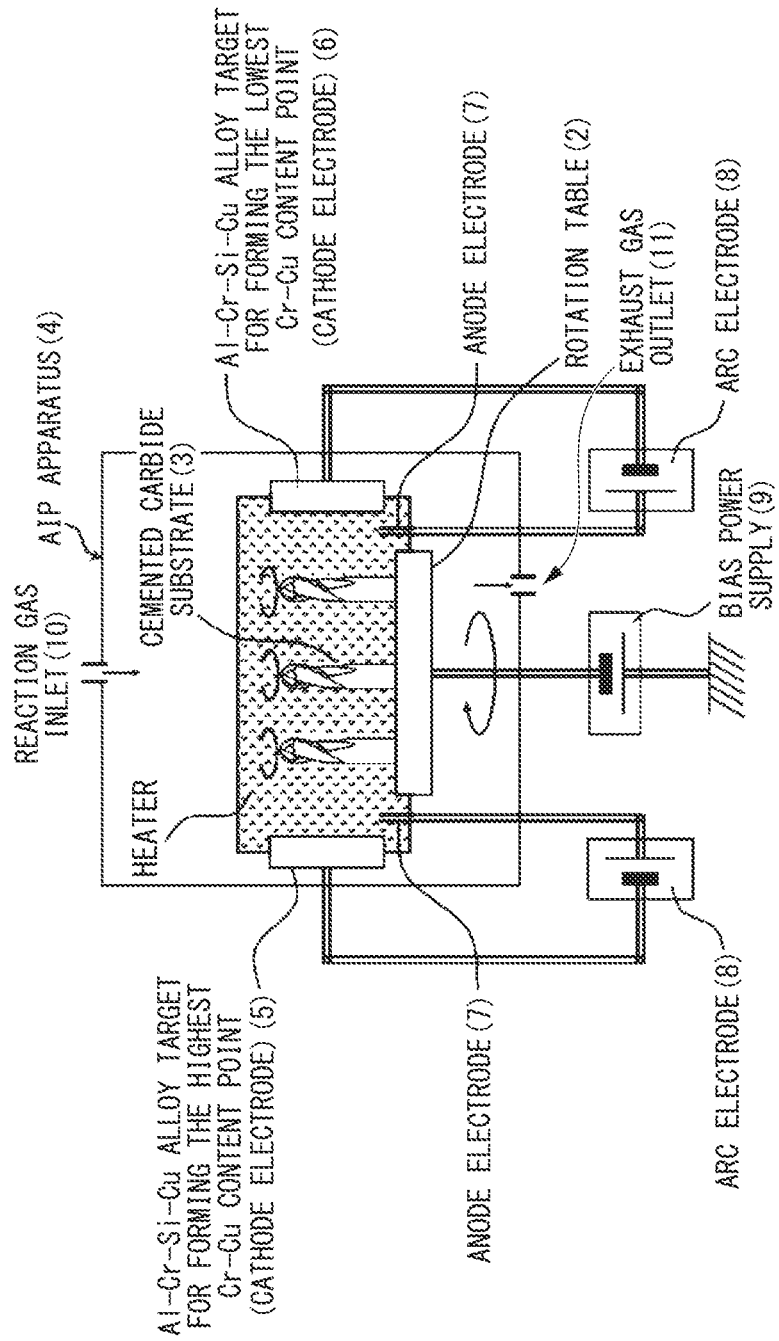
FIG. 3B is a schematic front view illustrating the arc ion plating (AIP) apparatus used to form the (Al,Cr,Si,Cu)N Layer of the coated tool according to the present invention.

(a) In a state where each of the above-described cutting tool bodies 1 to 3 was ultrasonically cleaned in acetone and was dried, each of the cutting tool bodies 1 to 3 was mounted along an outer circumferential portion at a position at a predetermined distance from a central axis of the rotation table (2) of the AIP apparatus (4) shown in FIG. 3 in a radial direction, and a Ti cathode electrode (not illustrated) for bombardment cleaning, an Al—Cr—Si—Cu alloy target (cathode electrode) (5) for forming the highest Cr content point having a predetermined composition, and an Al—Cr—Si—Cu alloy target (cathode electrode) (6) for forming the lowest Cr content point having a predetermined composition were disposed to face each other in the AIP apparatus (4).

(b) First, while the inside of the apparatus was evacuated and held in a vacuum, the tool body was heated to 400° C. using a heater (1). Next, a direct current bias voltage of −1000 V was applied to the tool body that was rotating while revolving on the rotation table (2) and a current of 100 A was caused to flow between a Ti cathode electrode and an anode electrode (7) such that arc discharge was generated. As a result, bombardment cleaning was performed on the surface of the tool body.

(c) Next, nitrogen gas as reaction gas was introduced into the apparatus to adjust a nitrogen pressure as shown in Table 2, a direct current bias voltage shown in Table 2 was applied while maintaining the temperature of the tool body that was rotating while revolving on the rotation table (2) in a temperature range shown in Table 2, and a current of 100 A was caused to simultaneously flow between the Al—Cr—Si—Cu alloy target (cathode electrode) (5) for forming the highest Cr content point and the anode electrode (7) and between the Al—Cr—Si—Cu alloy target (cathode electrode) (6) for forming the lowest Cr content point and the anode electrode (7) such that arc discharge is generated. As a result, a hard coating layer formed of an (Al,Cr,Si,Cu)N Layer having a predetermined composition, a desired average layer thickness, a period of composition modulation, and a continuous change in Cr component concentration including Crmax and Crmin as shown in Table 4 was deposited on a surface of the tool body. This way, each of surface-coated end mills 1 to 9 (hereinafter, referred to as Examples 1 to 9) as coated tools according to the present invention shown in Table 4 was manufactured.

In addition, in the step (c), nitrogen gas as reaction gas was introduced into the apparatus to adjust a nitrogen pressure as shown in Table 2, a direct current bias voltage shown in Table 2 was applied while maintaining the temperature of the tool body that was rotating while revolving on the rotation table (2) in a temperature range shown in Table 2, and a current of 100 A was caused to alternately flow between the Al—Cr—Si—Cu alloy target (cathode electrode) (5) for forming the highest Cr content point and the anode electrode (7) and between the Al—Cr—Si—Cu alloy target (cathode electrode) (6) for forming the lowest Cr content point and the anode electrode (7) such that arc discharge is generated. As a result, a hard coating layer formed of an (Al,Cr,Si,Cu)N Layer having a predetermined composition, a desired average layer thickness, a period of composition modulation, and a discontinuous (stepwise) change in Cr component concentration including Crmax and Crmin as shown in Table 5 was deposited. This way, each of surface-coated end mills 11 to 18 (hereinafter, referred to as Examples 11 to 18) as coated tools according to the present invention shown in Table 5 was manufactured.

Comparative Examples

For comparison, the step (c) of Examples was performed under conditions (that is, nitrogen pressure, temperature of tool body, and direct current bias voltage) shown in Table 3, and the other steps were performed under the same conditions as in Examples. As a result, each of surface-coated end mills 1 to 8 (hereinafter, referred to as Comparative Examples 1 to 8) shown in Table 6 as the coated tools according to Comparative Examples was manufactured. That is, all the (Al,Cr,Si,Cu)N Layers according to Comparative Examples 1 to 8 do not satisfy the requirements defined in the present invention.

Regarding each of Examples 1 to 18 (herein, 10 is a vacant number) and Comparative Examples 1 to 8 prepared as described above, a vertical section perpendicular to the surface of the tool body was cut using a focused ion beam (FIB). In a visual field that was set along the layer thickness direction to include the entire thickness region of the hard coating layer such that the width in a direction parallel to the surface of the tool body was 10 μm, the average composition of the (Al,Cr,Si,Cu)N Layer as a whole was obtained by energy-dispersive X-ray spectroscopy (EDS) using an electron scanning microscope (SEM).

In addition, the layer thicknesses of fives points of the vertical section were measured using the electron scanning microscope, and the average layer thickness was calculated from the average value of the measured values of the five points.

Further, each of the (Al,Cr,Si,Cu)N Layers according to Examples 1 to 18 (here, 10 is a vacant number) and Comparative Examples 1 to 8 was analyzed along the layer thickness direction by energy-dispersive X-ray spectroscopy (EDS) using an electron scanning microscope (SEM) and a transmission electron microscope (TEM) to measure the value of the Cr concentration Crmax in the highest Cr content point, the value of the Cr concentration Crmin in the lowest Cr content point, and the interval between the highest Cr content point and the lowest Cr content point. The average composition, the value of Crmax, the value of Crmin, and the interval between the highest Cr content point and the lowest Cr content point were obtained as the average values of measured values of each of the layers by performing the EDS measurement at five or more positions along the layer thickness direction. Tables 4 to 6 show the measured values and the calculated values.

Further, each of the (Al,Cr,Si,Cu)N Layers according to Examples 1 to 18 (here, 10 is a vacant number) and Comparative Examples 1 to 8 was analyzed by X-ray diffraction. In either case, it was found that crystals having a cubic structure or a hexagonal structure were present.

The X-ray diffraction was performed under conditions of measurement condition: Cu bulb, measurement range (2θ): 30 to 80 degrees, scan step: 0.013 degrees, and measurement time per step: 0.48 sec/step.

TABLE 1

| | Type | Co | (Ti, W)C | TaC | NbC | ZrC | $Cr_3C_2$ | VC | WC | Diameter × Length of Cutting Edge Portion (mm) |
|---|---|---|---|---|---|---|---|---|---|---|
| Tool body | 1 | 5 | 5 | — | — | — | — | — | Medium Coarse Powder: Balance | 6 × 12 |
| | 2 | 6 | — | 1 | 0.5 | — | — | — | Fine Powder: Balance | 6 × 12 |
| | 3 | 6 | — | 1 | — | 1 | 0.5 | 0.5 | Fine Powder: Balance | 6 × 12 |

TABLE 2

| | | | Target Composition (Atomic Ratio) | | | | | | Deposition Conditions | | |
|---|---|---|---|---|---|---|---|---|---|---|---|
| | | | For Forming Highest Cr Content Point | | | For Forming Lowest Cr Content Point | | | Temperature of Tool body | Nitrogen Partial Pressure | Bias Voltage |
| Type | | Tool body symbol | a | b | c | a | b | c | (° C.) | (Pa) | (−V) |
| Present Invention | 1 | 11 1 | 0.30 | 0.10 | 0.00 | 0.18 | 0.10 | 0.02 | 400 | 9.3 | −150 |
| | 2 | 12 2 | 0.18 | 0.10 | 0.02 | 0.12 | 0.18 | 0.02 | 400 | 4.0 | −100 |
| | 3 | 13 3 | 0.20 | 0.06 | 0.00 | 0.18 | 0.10 | 0.02 | 450 | 9.3 | −75 |
| | 4 | 14 1 | 0.32 | 0.02 | 0.10 | 0.30 | 0.10 | 0.00 | 500 | 4.0 | −125 |
| | 5 | 15 2 | 0.28 | 0.00 | 0.00 | 0.22 | 0.22 | 0.06 | 450 | 6.7 | −100 |
| | 6 | 16 1 | 0.20 | 0.06 | 0.00 | 0.15 | 0.12 | 0.06 | 400 | 6.7 | −100 |
| | 7 | 17 3 | 026 | 0.00 | 0.00 | 0.18 | 0.10 | 0.02 | 450 | 6.7 | −125 |
| | 8 | 18 1 | 0.45 | 0.20 | 0.01 | 0.26 | 0.00 | 0.00 | 500 | 9.3 | −150 |
| | 9 | 3 | 0.22 | 0.22 | 0.08 | 0.12 | 0.18 | 0.02 | 350 | 4.0 | −150 |

TABLE 3

| | | | Target Composition (Atomic Ratio) | | | | | | Deposition Conditions | | |
|---|---|---|---|---|---|---|---|---|---|---|---|
| | | | For Forming Highest Cr Content Point | | | For Forming Lowest Cr Content Point | | | Temperature of Tool body | Nitrogen Partial Pressure | Bias Voltage |
| Type | | Tool body symbol | a | b | c | a | b | c | (° C.) | (Pa) | (−V) |
| Comparative Example | 1 | 2 | 0.25 | 0.12 | 0.10 | 0.18 | 0.05 | 0.10 | 450 | 2.7 | −75 |
| | 2 | 3 | 0.22 | 0.00 | 0.04 | 0.12 | 0.17 | 0.02 | 400 | 6.7 | −50 |
| | 3 | 1 | 0.15 | 0.10 | 0.03 | 0.10 | 0.17 | 0.01 | 350 | 4.0 | −25 |
| | 4 | 2 | 0.20 | 0.30 | 0.06 | 0.14 | 0.30 | 0.00 | 500 | 2.7 | −50 |
| | 5 | 3 | 0.25 | 0.20 | 0.00 | 0.20 | 0.15 | 0.10 | 450 | 4.0 | −50 |
| | 6 | 1 | 0.48 | 0.02 | 0.01 | 0.30 | 0.09 | 0.01 | 550 | 9.3 | −200 |
| | 7 | 3 | 0.20 | 0.00 | 0.05 | 0.12 | 0.40 | 0.02 | 400 | 4.0 | −50 |
| | 8 | 1 | 0.40 | 0.10 | 0.00 | 0.22 | 0.04 | 0.03 | 350 | 2.7 | −25 |

TABLE 4

| | | | (Al, Cr, Si, Cu)N Layer | | | | | | |
|---|---|---|---|---|---|---|---|---|---|
| | | | Average Composition (Atomic Ratio) | | | Crmax of Highest Cr Content Point (Average Value) | Crmin of Lowest Cr Content Point (Average Value) | Average Interval (nm) between Highest Cr Content Point and Lowest Cr Content Point | Average Layer Thickness |
| Type | | Tool body symbol | a | b | c | | | | (μm) |
| Present Invention | 1 | 1 | 0.25 | 0.10 | 0.008 | 0.31 | 0.18 | 16 | 3.5 |
| | 2 | 2 | 0.16 | 0.14 | 0.02 | 0.18 | 0.13 | 30 | 4.0 |

TABLE 4-continued

| | | Average Composition (Atomic Ratio) | | | Crmax of Highest Cr Content Point (Average | Crmin of Lowest Cr Content Point (Average | Average Interval (nm) between Highest Cr Content Point and Lowest | Average Layer Thickness |
|---|---|---|---|---|---|---|---|---|
| Type | Tool body symbol | a | b | c | Value) | Value) | Cr Content Point | (μm) |
| | 3 | 3 | 0.20 | 0.08 | 0.01 | 0.21 | 0.18 | 74 | 3.0 |
| | 4 | 1 | 0.31 | 0.06 | 0.04 | 0.32 | 0.30 | 5 | 6.0 |
| | 5 | 2 | 0.25 | 0.10 | 0.03 | 0.28 | 0.23 | 25 | 2.0 |
| | 6 | 1 | 0.18 | 0.09 | 0.03 | 0.22 | 0.15 | 21 | 3.5 |
| | 7 | 3 | 0.22 | 0.05 | 0.01 | 0.26 | 0.18 | 14 | 3.0 |
| | 8 | 1 | 0.35 | 0.11 | 0.005 | 0.45 | 0.26 | 40 | 1.0 |
| | 9 | 3 | 0.17 | 0.20 | 0.05 | 0.22 | 0.12 | 95 | 7.5 |

TABLE 5

| | | Average Composition (Atomic Ratio) | | | Crmax of Highest Cr Content Point (Average | Crmin of Lowest Cr Content Point (Average | Average Interval (nm) between Highest Cr Content Point and Lowest | Average Layer Thickness |
|---|---|---|---|---|---|---|---|---|
| Type | Tool body symbol | a | b | c | Value) | Value) | Cr Content Point | (μm) |
| Present Invention | 11 | 1 | 0.24 | 0.10 | 0.01 | 0.30 | 0.17 | 15 | 3.5 |
| | 12 | 2 | 0.15 | 0.14 | 0.02 | 0.18 | 0.12 | 32 | 4.0 |
| | 13 | 3 | 0.19 | 0.08 | 0.01 | 0.20 | 0.18 | 72 | 3.0 |
| | 14 | 1 | 0.31 | 0.07 | 0.04 | 0.33 | 0.30 | 6 | 6.0 |
| | 15 | 2 | 0.24 | 0.11 | 0.03 | 0.28 | 0.22 | 25 | 2.0 |
| | 16 | 1 | 0.18 | 0.09 | 0.03 | 0.20 | 0.15 | 19 | 3.5 |
| | 17 | 3 | 0.22 | 0.05 | 0.01 | 0.26 | 0.18 | 13 | 3.0 |
| | 18 | 1 | 0.36 | 0.10 | 0.005 | 0.45 | 0.26 | 40 | 1.0 |

TABLE 6

| | | Average Composition (Atomic Ratio) | | | Crmax of Highest Cr Content Point (Average | Crmin of Lowest Cr Content Point (Average | Average Interval (nm) between Highest Cr Content Point and Lowest | Average Layer Thickness |
|---|---|---|---|---|---|---|---|---|
| Type | Tool body symbol | a | b | c | Value) | Value) | Cr Content Point | (μm) |
| Comparative Example | 1 | 2 | 0.21 | 0.08 | *0.10 | 0.25 | 0.17 | 60 | 2.0 |
| | 2 | 3 | 0.16 | 0.10 | 0.03 | *0.22 | 0.12 | 10 | 4.0 |
| | 3 | 1 | *0.12 | 0.14 | 0.02 | 0.15 | 0.11 | 30 | 1.0 |
| | 4 | 2 | 0.19 | *0.30 | 0.05 | 0.21 | 0.14 | 5 | 5.5 |
| | 5 | 3 | 0.23 | 0.18 | 0.04 | 0.25 | 0.20 | 20 | *0.3 |
| | 6 | 1 | 0.38 | 0.06 | 0.01 | 0.48 | 0.31 | *150 | 3.0 |
| | 7 | 3 | 0.17 | 0.15 | 0.04 | 0.20 | 0.12 | 20 | *9.5 |
| | 8 | 1 | 0.28 | 0.06 | 0.02 | *0.40 | 0.22 | 50 | 2.5 |

*represents a value that is outside of the range defined in the scope of the present invention Next, regarding each of the end mills of Examples 1 to 18 (here, 10 is a vacant number) and Comparative Examples 1 to 8, a side face cutting test of alloy tool steel was performed under the following conditions (referred to as "cutting conditions A").

Work material—a plate material of JIS SKD11 (60HRC) having planar dimensions of 100 mm×250 mm and a thickness of 50 mm
  Cutting speed: 100 m/min
  Rotational speed: 5400 min.$^{-1}$
  Depth of cut: ae 0.24 mm, ap 2 mm
  Feed rate (per tooth): 0.06 mm/tooth
  Cutting length: 32 m Further, a side face cutting test of high-speed tool steel was performed under the following conditions (referred to as "cutting conditions B").

Work material—a plate material of JIS SKH51 (64HRC) having planar dimensions of 100 mm×250 mm and a thickness of 50 mm
  Cutting speed: 100 m/min
  Rotational speed: 5400 min.$^{-1}$
  Depth of cut: ae 0.22 mm, ap 2.0 mm Feed rate (per tooth): 0.06 mm/tooth
Cutting fluid: air blow
Cutting length: 16 m The wear width of the flank face of a cutting edge in any of the side face cutting tests was measured. The measurement results are shown in Table 7.

TABLE 7

| Type | | Width of Wear on Flank Face (mm) | | Type | | Width of Wear on Flank Face (mm) | | Type | | Width of Wear on Flank Face (mm) | |
|---|---|---|---|---|---|---|---|---|---|---|---|
| | | Cutting Conditions (A) | Cutting Conditions (B) | | | Cutting Conditions (A) | Cutting Conditions (B) | | | Cutting Conditions (A) | Cutting Conditions (B) |
| Present Invention | 1 | 0.08 | 0.07 | Present Invention | 11 | 0.10 | 0.09 | Comparative Example | 1 | 0.18 | *14 m |
| | 2 | 0.06 | 0.05 | | 12 | 0.07 | 0.07 | | 2 | 0.15 | 0.17 |
| | 3 | 0.06 | 0.07 | | 13 | 0.08 | 0.09 | | 3 | *24 m | *12 m |
| | 4 | 0.09 | 0.09 | | 14 | 0.11 | 0.12 | | 4 | *18 m | *8 m |
| | 5 | 0.06 | 0.07 | | 15 | 0.08 | 0.09 | | 5 | *28 m | 0.19 |
| | 6 | 0.04 | 0.04 | | 16 | 0.06 | 0.06 | | 6 | *14 m | *6 m |
| | 7 | 0.05 | 0.06 | | 17 | 0.08 | 0.07 | | 7 | *30 m | 0.18 |
| | 8 | 0.10 | 0.09 | | 18 | 0.12 | 0.13 | | 8 | *20 m | *8 m |
| | 9 | 0.08 | 0.09 | | | | | | | | |

(In the table, (*) in the item of Comparative Example represents the cutting length (m) until the service life (Width of Wear on Flank Face: 0.2 mm) ends due to chipping and wear)

The following was found from the results shown in Table 7. The coated tool according to the present invention includes at least the (Al,Cr,Si,Cu)N Layer having the predetermined average composition as the hard coating layer, and the composition modulated structure of the Cr component is formed in the layer. As a result, the (Al,Cr,Si,Cu)N Layer has toughness and wear resistance. Therefore, excellent chipping resistance and wear resistance are exhibited during cutting work of high hardness steel such as hardened steel, and excellent cutting performance is exhibited for a long-term usage.

On the other hand, in the coated tools according to Comparative Examples in which the average composition of the (Al,Cr,Si,Cu)N Layer forming the hard coating layer or the composition modulated structure of the Cr component does not satisfy the requirements of the present invention, it is obvious that the service life ends within a short period of time due to the occurrence and propagation of cracking or wear progression.

Example 2

Each of cutting tool bodies (end mills) 1 to 3 formed of WC-based cemented carbide as in the case of Example 1 was manufactured.

(a) In a state where each of the above-described cutting tool bodies 1 to 3 was ultrasonically cleaned in acetone and was dried, each of the cutting tool bodies 1 to 3 was mounted along an outer circumferential portion at a position at a predetermined distance from a central axis of the rotation table (2) of the AIP apparatus (4) shown in FIG. 3 in a radial direction, and a Ti cathode electrode (not illustrated) for bombardment cleaning, an Al—Cr—Si—Cu alloy target (cathode electrode) (5) for forming the highest content points of Cr and Cu having a predetermined composition, and an Al—Cr—Si—Cu alloy target (cathode electrode) (6) for forming the lowest content points and Cr and Cu having a predetermined composition were disposed to face each other in the AIP apparatus (4).

(b) First, while the inside of the apparatus was evacuated and held in a vacuum, the tool body was heated to 400° C. using a heater (1). Next, a direct current bias voltage of −1000 V was applied to the tool body that was rotating while revolving on the rotation table (2) and a current of 100 A was caused to flow between a Ti cathode electrode and an anode electrode (7) such that arc discharge was generated. As a result, bombardment cleaning was performed on the surface of the tool body.

(c) Next, nitrogen gas as reaction gas was introduced into the apparatus to adjust a nitrogen pressure as shown in Table 8, a direct current bias voltage shown in Table 8 was applied while maintaining the temperature of the tool body that was rotating while revolving on the rotation table (2) in a temperature range shown in Table 8, and a current of 100 A was caused to simultaneously flow between the Al—Cr—Si—Cu alloy target (cathode electrode) (5) for forming the highest content points of Cr and Cu and the anode electrode (7) and between the Al—Cr—Si—Cu alloy target (cathode electrode) (6) for forming the lowest content points of Cr and Cu and the anode electrode (7) such that arc discharge is generated. As a result, a hard coating layer formed of an (Al,Cr,Si,Cu)N Layer having a predetermined composition, a desired average layer thickness, a period of composition modulation, and a continuous change in respective component concentrations including Crmax, Cumax, Crmin, and Cumin as shown in Table 10 was deposited on a surface of the tool body. This way, each of surface-coated end mills 21 to 30 (hereinafter, referred to as Examples 21 to 30) as coated tools according to the present invention shown in Table 10 was manufactured.

Comparative Examples

For comparison, the step (c) of Examples was performed under conditions (that is, nitrogen pressure, temperature of tool body, and direct current bias voltage) shown in Table 9, and the other steps were performed under the same conditions as in Examples. As a result, each of surface-coated end mills 11 to 20 (hereinafter, referred to as Comparative Example s 11 to 20) as coated tools according to Comparative Examples shown in Table 11 was manufactured. That is, all the (Al,Cr,Si,Cu)N Layers according to Comparative Examples 11 to 20 do not satisfy the requirements defined in the present invention.

Further, for reference, using an Al—Cr—Si—Cu alloy target (cathode electrode) having one kind of composition, an (Al,Cr,Si,Cu)N Layer was formed under conditions (that is, nitrogen pressure, temperature of tool body, and direct current bias voltage) shown in Table 9. This way, surface-coated end mills 1 to 3 (hereinafter, referred to as Reference Examples 1 to 3) as coated tools according to Reference Examples shown in Table 11 was manufactured.

Regarding each of Examples 21 to 30 and Comparative Examples 11 to 20 prepared as described above, the highest Cr content point, the lowest Cr content point, the highest Cu content point, and the lowest Cu content point were measured at a plurality of positions using the same method as in Example 1, and the average values thereof were obtained. As a result, the average composition of the (Al,Cr,Si,Cu)N Layer as a whole, the value of the Cr concentration Crmax, the value of the Cu concentration Cumax, the value of the Cr concentration Crmin in the lowest content points of Cr and Cu, the value of the Cu concentration Cumin, the interval between the highest Cr content point and the lowest Cr content point, and the interval between the highest Cu content point and the lowest Cu content point were obtained.

In addition, regarding each of the (Al,Cr,Si,Cu)N Layers of according to Examples 21 to 30 and Comparative Examples 11 to 20, the Cr concentrations $a_{zn}$ and the Cu concentrations $c_{zn}$ in predetermined 20 measurement points zn (n=1, 2, 3, . . . , and 20) along the layer thickness direction were measured to calculate values of $(c_{zn}/a_{zn})/(c/a)$. Among these values, a maximum value and a minimum value were obtained. Further, each of the (Al,Cr,Si,Cu)N Layers according to Examples 21 to 30, Comparative Examples 1 to 10, and Reference Examples 1 to 3 was analyzed by X-ray diffraction. In either case, it was found that crystals having a cubic structure or a hexagonal structure were present.

The X-ray diffraction was performed under the same conditions as in Example 1.

Tables 10 and 11 show the measured values and the calculated values.

TABLE 8

| | | | Target Composition (Atomic Ratio) | | | | | Deposition Conditions | | |
| | | | For Forming Highest Content Points of Cr and Cu | | | For Forming Lowest Content Points of Cr and Cu | | | Temperature of Tool body | Nitrogen Partial Pressure | Bias Voltage |
| Type | | Tool body symbol | a | b | c | a | b | C | (° C.) | (Pa) | (−V) |
|---|---|---|---|---|---|---|---|---|---|---|---|
| Present Invention | 21 | 1 | 0.45 | 0.05 | 0.005 | 0.35 | 0.05 | 0.004 | 450 | 3.5 | −50 |
| | 22 | 2 | 0.40 | 0.10 | 0.012 | 0.25 | 0.10 | 0.007 | 450 | 3.5 | −50 |
| | 23 | 3 | 0.30 | 0.12 | 0.012 | 0.15 | 0.12 | 0.006 | 500 | 4.2 | −50 |
| | 24 | 1 | 0.25 | 0.20 | 0.020 | 0.20 | 0.20 | 0.016 | 500 | 4.2 | −50 |
| | 25 | 2 | 0.30 | 0.05 | 0.055 | 0.20 | 0.05 | 0.038 | 500 | 4.0 | −70 |
| | 26 | 3 | 0.25 | 0.08 | 0.012 | 0.15 | 0.08 | 0.007 | 450 | 4.0 | −70 |
| | 27 | 1 | 0.25 | 0.08 | 0.025 | 0.15 | 0.08 | 0.015 | 450 | 4.0 | −70 |
| | 28 | 2 | 0.23 | 0.08 | 0.060 | 0.15 | 0.08 | 0.040 | 450 | 4.0 | −70 |
| | 29 | 3 | 0.23 | 0.05 | 0.060 | 0.15 | 0.05 | 0.040 | 450 | 5.0 | −100 |
| | 30 | 1 | 0.20 | 0.08 | 0.040 | 0.13 | 0.08 | 0.025 | 400 | 5.0 | −100 |

TABLE 9

| | | | Target Composition (Atomic Ratio) | | | | | | Deposition Conditions | | |
| | | | For Forming Highest Content Points of Cr and Cu | | | For Forming Lowest Content Points of Cr and Cu | | | Temperature of Tool body | Nitrogen Partial Pressure | Bias Voltage |
| Type | | Tool body symbol | a | b | c | a | b | c | (° C.) | (Pa) | (−V) |
|---|---|---|---|---|---|---|---|---|---|---|---|
| Comparative Example | 11 | 1 | 0.50 | 0.05 | 0.005 | 0.35 | 0.05 | 0.003 | 450 | 3.5 | −50 |
| | 12 | 2 | 0.55 | 0.01 | 0.010 | 0.25 | 0.01 | 0.005 | 450 | 3.5 | −50 |
| | 13 | 3 | 0.28 | 0.25 | 0.010 | 0.18 | 0.25 | 0.006 | 500 | 4.2 | −50 |
| | 14 | 1 | 0.28 | 0.20 | 0.000 | 0.20 | 0.20 | 0.000 | 500 | 4.2 | −50 |
| | 15 | 2 | 0.28 | 0.05 | 0.140 | 0.20 | 0.05 | 0.010 | 500 | 4.0 | −70 |
| | 16 | 3 | 0.23 | 0.08 | 0.010 | 0.15 | 0.08 | 0.006 | 450 | 4.0 | −70 |
| | 17 | 1 | 0.25 | 0.08 | 0.025 | 0.18 | 0.08 | 0.017 | 450 | 4.0 | −70 |
| | 18 | 2 | 0.23 | 0.08 | 0.060 | 0.18 | 0.08 | 0.025 | 450 | 4.0 | −70 |
| | 19 | 3 | 0.23 | 0.05 | 0.060 | 0.15 | 0.05 | 0.040 | 450 | 5.0 | −100 |
| | 20 | 1 | 0.20 | 0.08 | 0.060 | 0.05 | 0.08 | 0.010 | 400 | 5.0 | −100 |
| Reference Example | 1 | 1 | a: 0.30, b: 0.08, c: 0.050 | | | | | | 450 | 4.0 | −50 |
| | 2 | 2 | a: 0.25, b: 0.05, C: 0.050 | | | | | | 450 | 4.0 | −50 |
| | 3 | 3 | a: 0.20, b: 0.08, C: 0.050 | | | | | | 450 | 4.0 | −50 |

TABLE 10

| | | | Average composition (AtomicRatio) | | | Highest Content Points of Cu and Cr | | | Lowest Content Points of Cu and Cr | | |
|---|---|---|---|---|---|---|---|---|---|---|---|
| Type | | Tool body symbol | a | b | c | Crmax | Cumax | Crmax/a | Crmin | Cumin | Crmin/a |
| Present Invention | 21 | 1 | 0.40 | 0.05 | 0.005 | 0.43 | 0.005 | 1.08 | 0.36 | 0.005 | 0.90 |
| | 22 | 2 | 0.33 | 0.10 | 0.010 | 0.39 | 0.012 | 1.18 | 0.27 | 0.007 | 0.82 |
| | 23 | 3 | 0.23 | 0.12 | 0.009 | 0.28 | 0.012 | 1.22 | 0.17 | 0.005 | 0.74 |
| | 24 | 1 | 0.23 | 0.20 | 0.015 | 0.24 | 0.020 | 1.04 | 0.21 | 0.010 | 0.91 |
| | 25 | 2 | 0.25 | 0.05 | 0.047 | 0.28 | 0.055 | 1.12 | 0.22 | 0.038 | 0.88 |
| | 26 | 3 | 0.20 | 0.08 | 0.010 | 0.24 | 0.012 | 1.20 | 0.16 | 0.007 | 0.80 |
| | 27 | 1 | 0.20 | 0.08 | 0.020 | 0.23 | 0.025 | 1.15 | 0.16 | 0.015 | 0.80 |
| | 28 | 2 | 0.18 | 0.08 | 0.050 | 0.20 | 0.060 | 1.11 | 0.16 | 0.040 | 0.89 |
| | 29 | 3 | 0.19 | 0.05 | 0.050 | 0.20 | 0.060 | 1.05 | 0.17 | 0.040 | 0.89 |
| | 30 | 1 | 0.16 | 0.08 | 0.044 | 0.18 | 0.050 | 1.13 | 0.14 | 0.038 | 0.88 |

| | | Interval (nm) between Highest Content Points of Cu and Cr and Lowest Content Points of Cu and Cr | $(c_z/a_z)/(c/a)$ | | Average Layer Thickness (μm) |
|---|---|---|---|---|---|
| Type | | | Maximum Value | Minimum Value | |
| Present Invention | 21 | 10 | 1.10 | 0.92 | 0.5 |
| | 22 | 100 | 1.07 | 0.90 | 1.3 |
| | 23 | 5 | 1.13 | 0.78 | 2.8 |
| | 24 | 85 | 1.25 | 0.71 | 3.1 |
| | 25 | 10 | 1.06 | 0.93 | 3.0 |
| | 26 | 50 | 1.05 | 0.92 | 4.1 |
| | 27 | 10 | 1.06 | 0.91 | 3.6 |
| | 28 | 30 | 1.08 | 0.90 | 4.1 |
| | 29 | 30 | 1.11 | 0.87 | 5.4 |
| | 30 | 60 | 1.03 | 0.88 | 7.8 |

TABLE 11

| | | | Average composition (AtomicRatio) | | | Highest Content Points of Cu and Cr | | | Lowest Content Points of Cu and Cr | | |
|---|---|---|---|---|---|---|---|---|---|---|---|
| Type | | Tool body symbol | a | b | c | Crmax | Cumax | Crmax/a | Crmin | Cumin | Crmin/a |
| Comparative Example | 11 | 1 | 0.43* | 0.05 | 0.004* | 0.50 | 0.005 | 1.16 | 0.35 | 0.003 | 0.81 |
| | 12 | 2 | 0.40 | 0.06 | 0.008 | 0.55 | 0.010 | 1.38* | 0.25 | 0.005 | 0.63 |
| | 13 | 3 | 0.23 | 0.25* | 0.008 | 0.28 | 0.010 | 1.22 | 0.18 | 0.006 | 0.78 |
| | 14 | 1 | 0.24 | 0.20 | 0* | 0.28 | 0.000 | 1.17 | 0.20 | 0.000 | 0.83 |
| | 15 | 2 | 0.24 | 0.05 | 0.053* | 0.28 | 0.060 | 1.17 | 0.20 | 0.045 | 0.83 |
| | 16 | 3 | 0.19 | 0.08 | 0.008 | 0.23 | 0.010 | 1.21 | 0.15 | 0.006 | 0.79 |
| | 17 | 1 | 0.21 | 0.08 | 0.021 | 0.25 | 0.025 | 1.19 | 0.18 | 0.017 | 0.86 |
| | 18 | 2 | 0.20 | 0.08 | 0.048 | 0.23 | 0.070 | 1.15 | 0.18 | 0.025 | 0.90 |
| | 19 | 3 | 0.19 | 0.05 | 0.050 | 0.23 | 0.060 | 1.21 | 0.15 | 0.040 | 0.79 |
| | 20 | 1 | 0.13* | 0.08 | 0.025 | 0.20 | 0.040 | 1.54* | 0.05 | 0.010 | 0.38* |
| Reference Example | 1 | 1 | a: 0.30, b: 0.08, c: 0.050 | | | | | | | | |
| | 2 | 2 | a: 0.25, b: 0.05, c: 0.050 | | | | | | | | |
| | 3 | 3 | a: 0.20, b: 0.08, c: 0.050 | | | | | | | | |

| | | Interval (nm) between Highest Content Points of Cu and Cr and Lowest Content Points of Cu and Cr | $(c_x/a_x)/(c/a)$ | | Average Layer Thickness (μm) |
|---|---|---|---|---|---|
| Type | | | Maximum Value | Minimum Value | |
| Comparative Example | 11 | 30 | 1.06 | 0.91 | 4.2 |
| | 12 | 20 | 1.07 | 0.97 | 4.1 |
| | 13 | 30 | 1.02 | 0.96 | 3.5 |
| | 14 | 50 | # | # | 4.2 |
| | 15 | 80 | 1.02 | 0.99 | 3.5 |
| | 16 | 150* | 1.04 | 0.93 | 4.2 |
| | 17 | 1* | 1.01 | 0.98 | 4.2 |
| | 18 | 50 | 1.31 | 0.60* | 3.4 |
| | 19 | 80 | 1.00 | 1.00 | 0.3* |

TABLE 11-continued

|  |  |  |  |  |  |
|---|---|---|---|---|---|
|  | 20 | 60 |  | 1.00 | 1.00 | 8.5* |
| Reference | 1 | a: 0.30, b: 0.08, c: 0.050 |  |  | 3.5 |
| Example | 2 | a: 0.25, b: 0.05, c: 0.050 |  |  | 3.5 |
|  | 3 | a: 0.20, b: 0.08, c: 0.050 |  |  | 4.2 |

(Note)
*represents a value outside of the range defined in the scope of the present invention
(Note)
in (cz/az)/(c/a) represents Example not including Cu Next, a side face cutting test of hardened steel was performed on each of the end mills according to Examples 21 to 30, Comparative Examples 11 to 20, and Reference Examples 1 to 3 under the following cutting conditions C and D.

<Cutting Conditions C>

Work material—a plate material of JIS SKD11 (60HRC) having planar dimensions of 100 mm×250 mm and a thickness of 50 mm Cutting speed: 107 m/min
Rotational speed: 6000 min.$^{-1}$
Depth of cut: ae 0.20 mm, ap 2.0 mm
Feed rate (per tooth): 0.05 mm/tooth
Cutting length: 32 m <Cutting Conditions D>

Work material—a plate material of JIS SKH51 (64HRC) having planar dimensions of 100 mm×250 mm and a thickness of 50 mm Cutting speed: 107 m/min
Rotational speed: 6000 min.$^{-1}$
Depth of cut: ae 0.20 mm, ap 2.0 mm
Feed rate (per tooth): 0.05 mm/tooth
Cutting length: 18 m The wear width of the flank face of a cutting edge in any of the side face cutting tests was measured. The measurement results are shown in Table 12.

The following was found from the results shown in Table 12. The coated tool according to the present invention includes at least the (Al,Cr,Si,Cu)N Layer having the predetermined average composition as the hard coating layer, and the composition modulated structures of the Cr component and the Cu component is formed in the layer. As a result, the (Al,Cr,Si,Cu)N Layer has cracking resistance and wear resistance. Therefore, excellent cutting performance is exhibited for a long-term usage during high-speed intermittent cutting work of high hardness steel such as hardened steel.

On the other hand, in the coated tools according to Comparative Examples and the coated tools according to Reference Examples in which the average composition of the (Al,Cr,Si,Cu)N Layer forming the hard coating layer or the composition modulated structures of the Cr component and the Cu component does not satisfy the requirements of the present invention, it is obvious that the service life ends within a short period of time due to the occurrence and propagation of cracking or wear progression.

INDUSTRIAL APPLICABILITY

In a case where the coated tool according to the present invention is used for high-speed intermittent cutting work of high hardness steel, excellent cracking resistance and wear

TABLE 12

| Type | | Width of Wear on Flank Face (mm) | | Type | | Width of Wear on Flank Face (mm) | | Main Reason for End of Service Life |
|---|---|---|---|---|---|---|---|---|
| | | Cutting Conditions (C) | Cutting Conditions (D) | | | Cutting Conditions (C) | Cutting Conditions (D) | |
| Present Invention | 21 | 0.16 | 0.18 | Comparative Example | 11 | 12* | 6* | Wear Progression |
| | 22 | 0.14 | 0.15 | | 12 | 15* | 12* | Wear Progression |
| | 23 | 0.14 | 0.16 | | 13 | 18* | 15* | Wear Progression |
| | 24 | 0.13 | 0.16 | | 14 | 18* | 15* | Wear Progression and Chipping Caused by Crack Propagation |
| | 25 | 0.12 | 0.16 | | 15 | 21* | 17* | Wear Progression |
| | 26 | 0.09 | 0.15 | | 16 | 24* | 17* | Wear Progression and Chipping Caused by Crack Propagation |
| | 27 | 0.09 | 0.13 | | 17 | 21* | 17* | Wear Progression and Chipping Caused by Crack Propagation |
| | 28 | 0.08 | 0.14 | | 18 | 0.19 | 0.20 | Wear Progression |
| | 29 | 0.12 | 0.16 | | 19 | 6* | 3* | Wear Progression |
| | 30 | 0.12 | 0.15 | | 20 | 15* | 12* | Chipping Caused by Crack Propagation |
| | | | | Reference Example | 1 | 12* | 6* | Chipping Caused by Crack Propagation |
| | | | | | 2 | 18* | 15* | Chipping Caused by Crack Propagation |
| | | | | | 3 | 18* | 15* | Chipping Caused by Crack Propagation |

((In the table, (*) in the items of Comparative Examples and Reference Examples represents the cutting length (m) until the service life (Width of Wear on Flank Face: 0.2 mm) ends due to cracking and wear)

resistance are exhibited for a long-term usage. Therefore, the coated cutting tool according to the present invention can satisfactorily cope with the factory automation of cutting apparatuses, power saving and energy saving during cutting work, and a further reduction in costs.

REFERENCE SIGNS LIST

L: DISTANCE IN LAYER THICKNESS DIRECTION
C: Cr CONTENT
P1: LOWEST Cr CONTENT POINT
P2: HIGHEST Cr CONTENT POINT
1: HEATER
2: ROTATION TABLE
3: CEMENTED CARBIDE BODY
4: AIP APPARATUS
5: Al—Cr—Si—Cu ALLOY TARGET (CATHODE ELECTRODE) FOR FORMING HIGHEST CONTENT POINTS OF Cr AND Cu
6: Al—Cr—Si—Cu ALLOY TARGET (CATHODE ELECTRODE) FOR FORMING LOWEST CONTENT POINTS OF Cr AND Cu
7: ANODE ELECTRODE
8: ARC ELECTRIC POWER SUPPLY
9: BIAS ELECTRIC POWER SUPPLY
10: REACTION GAS INLET
11: EXHAUST GAS OUTLET

The invention claimed is:
1. A surface-coated cutting tool comprising:
a tool body made of any of tungsten carbide-based cemented carbide, titanium carbonitride cermet and a cubic boron nitride sintered material; and
a hard coating layer that is provided on a surface of the tool body, wherein
(a) the hard coating layer includes at least a complex nitride layer of Al, Cr, Si, and Cu with an average layer thickness of 0.5 to 8.0 μm,
(b) in a case where the complex nitride layer is represented by a composition formula: $(Al_{1-a-b-c}Cr_aSi_bCu_c)N$, the complex nitride layer has an average composition that satisfies $0.15 \leq a \leq 0.40$, $0.05 \leq b \leq 0.20$, and $0.005 \leq c \leq 0.05$, each of a, b, and c being in atomic ratio,
(c) the complex nitride layer has a composition modulated structure in which a Cr component concentration periodically changes along a layer thickness direction,
(d) the periodic change in the Cr component concentration of the composition modulated structure is a change in which a highest content point of the Cr component and a lowest content point of the Cr component are repeated at an interval of 5 nm to 100 nm, and
(e) in a case where an average local maximum of the Cr component concentration in the highest content point of the Cr component is represented by Crmax, the average local maximum is in a range of $a \leq Crmax \leq 1.3a$, and in a case where an average local minimum of the Cr component concentration in the lowest content point of the Cr component is represented by Crmin, the average local minimum is in a range of $0.5 \leq Crmin < a$, where a represents the Cr average composition a in the composition formula of (b).

2. The surface-coated cutting tool according to claim 1, wherein the change in the Cr component concentration is a continuous change along the layer thickness direction.

3. A surface-coated cutting tool comprising:
a tool body made of any of tungsten carbide-based cemented carbide, titanium carbonitride-based cermet and a cubic boron nitride-based sintered material; and
a hard coating layer that is provided on a surface of the tool body, wherein
(a) the hard coating layer includes at least a complex nitride layer of Al, Cr, Si, and Cu with an average layer thickness of 0.5 to 8.0 μm,
(b) in a case where the complex nitride layer is represented by a composition formula: $(Al_{1-a-b-c}Cr_aSi_bCu_c)N$, the complex nitride layer has an average composition that satisfies $0.15 \leq a \leq 0.40$, $0.05 \leq b \leq 0.20$, and $0.005 \leq c \leq 0.05$, each of a, b, and c being in atomic ratio,
(c) the complex nitride layer has a composition modulated structure in which a Cr component concentration periodically changes along a layer thickness direction and a composition modulated structure in which a Cu component concentration periodically changes along the layer thickness direction,
(d) the periodic change in the Cr component concentration of the composition modulated structure is a change in which a highest content point of the Cr component and a lowest content point of the Cr component are repeated at an interval of 5 nm to 100 nm,
(e) an average local maximum Crmax of the Cr component concentration in the highest content point of the Cr component is in a range of $a < Crmax \leq 1.30a$, and an average local minimum Crmin of the Cr component concentration in the lowest content point of the Cr component is in a range of $0.5 \leq Crmin < a$, where a represents the Cr average composition a in the composition formula of (b),
(f) the periodic change in the Cu component concentration of the composition modulated structure is a change in which a highest content point of the Cu component and a lowest content point of the Cu component are repeated at an interval of 5 nm to 100 nm, and
(g) in a case where a Cu composition at one measurement point z along the layer thickness direction is represented by $c_z$ and a Cr composition at the measurement point z is represented by $a_z$, a value $((c_z/a_z)/(c/a))$ obtained by dividing a value $(c_z/a_z)$ of a ratio of $c_z$ to $a_z$ by a value $(c/a)$ of a ratio of a Cu average composition c to a Cr average composition a in the complex nitride layer is in a range of $0.7 \leq (c_z/a_z)/(c/a) \leq 1.5$ over the layer thickness direction entirely.

4. The surface-coated cutting tool according to claim 3, wherein the change in the Cr component concentration and the Cu component concentration is a continuous change along the layer thickness direction.

* * * * *